United States Patent [19]
Chen

[11] Patent Number: 5,119,174
[45] Date of Patent: Jun. 2, 1992

[54] LIGHT EMITTING DIODE DISPLAY WITH PCB BASE

[76] Inventor: Der-Jong Chen, 8, Alley 16, Lane 37, Tatung Rd. Sec. 1., Hsi-Chih Town, Taipei Hsien, Taiwan

[21] Appl. No.: 604,072

[22] Filed: Oct. 26, 1990

[51] Int. Cl.$^5$ .......................................... H01L 39/02
[52] U.S. Cl. ........................ 357/80; 357/81; 357/74; 357/75; 361/387; 361/388; 362/373; 362/800
[58] Field of Search ................ 357/80, 74, 17, 81, 357/75; 361/387, 388; 362/373, 800

[56] References Cited

U.S. PATENT DOCUMENTS

| | | | |
|---|---|---|---|
| 4,742,432 | 5/1988 | Thillays et al. | 361/400 |
| 4,935,665 | 6/1990 | Murata | 313/500 |
| 5,012,387 | 4/1991 | Ohlenburger | 361/388 |

FOREIGN PATENT DOCUMENTS 3305167 8/1984 Fed. Rep. of Germany ...... 361/387

Primary Examiner—Rolf Hille
Assistant Examiner—David Ostrowski
Attorney, Agent, or Firm—Asian Pacific Int'l Patent & Trademark Office

[57] ABSTRACT

A light emitting diode display with PCB base, LED members affixed thereon by conductive epoxy, and bonding wire, wherein the PCB is punched with reflector dish on each LED die attach zone so as to reflect and concentrate the light emitted from the LED to increase the luminous intensity of the display, and near each die attach zone is formed a plating through hole to increase the heat-dispersing area of the LED and improve the stability of the forward voltage and wave length (color) of the LED and decrease the light output degradation of the LED to prolong the life of the display.

1 Claim, 2 Drawing Sheets

LIGHT EMITTING DIODE DISPLAY WITH PCB BASE

BACKGROUND OF THE INVENTION

The present invention relates to an improved light emitting diode display with PCB (printed circuit board) base, and more particularly to a LED display with higher luminous intensity, greater heat-dispersing area, increased stability of the forward voltage and wave length (color) of the LED and decreased light output degradation and prolonged operating lifespan.

At present, all the developed countries of the world positively research and develop photoelectric materials. However, respecting the packaging technique of LED lamps, there have been relatively few advances.

Among the conventional packaging techniques, there is one type of packaging procedure wherein the diodes are first attached to lead frames and then encapsulated in epoxy to form bulb-like LED lamps. Because bowl-shaped reflector surfaces are formed on the die attach zones of the lead frame, higher luminous intensity can be achieved. The LED lamps can be arranged and soldered on a circuit board to form a display. However, such display is manufactured at high cost and the luminous intensity and color of the LED lamps are not so easily matched with each other. Another kind of display applies conductive epoxy to attach the LED to the PCB and applies conductive wires to connect the cathode and anode. Then, a reflector cover is added to complete the display. In such display, because the reflector cover is made from plastic and clearance exists between the PCB and reflector cover, the light reflecting and concentrating effect thereof is much poorer than that of the bowl-shaped reflector surfaces of the lead frame. Therefore, the luminous intensity of such display is lower. Moreover, because the basic material of the PCB is fiber glass with epoxy, the heat-conducting effect is poor and the heat conduction is limited within a small range of copper foil of the front surface of the PCB so that when the LED is powered on, the accompanying heat is difficult to disperse and thus the forward voltage and wave length (color) is not so stable and the illumination is reduced. Also, the lamp life is shortened.

SUMMARY OF THE INVENTION

It is an object of this invention to provide an improved LED display with PCB base, wherein on the PCB, each die attach zone for the LED is punched with a bowl-shaped reflector surface whereby the reflector surface will reflect and concentrate the light emitted from the LED to increase the luminous intensity of the display. Moreover, a plating through hole is disposed near each die attach zone for the LED so as to increase the heat-dispersing area without affecting the wire line arrangement. The arrangement improves the stability of the forward voltage and wave length (color) of the LED and decrease the degradating the light output of the LED to prolong the life of the display.

DETAILED DESCRIPTION OF THE PREFERRED EMBODIMENT

Figure 1:
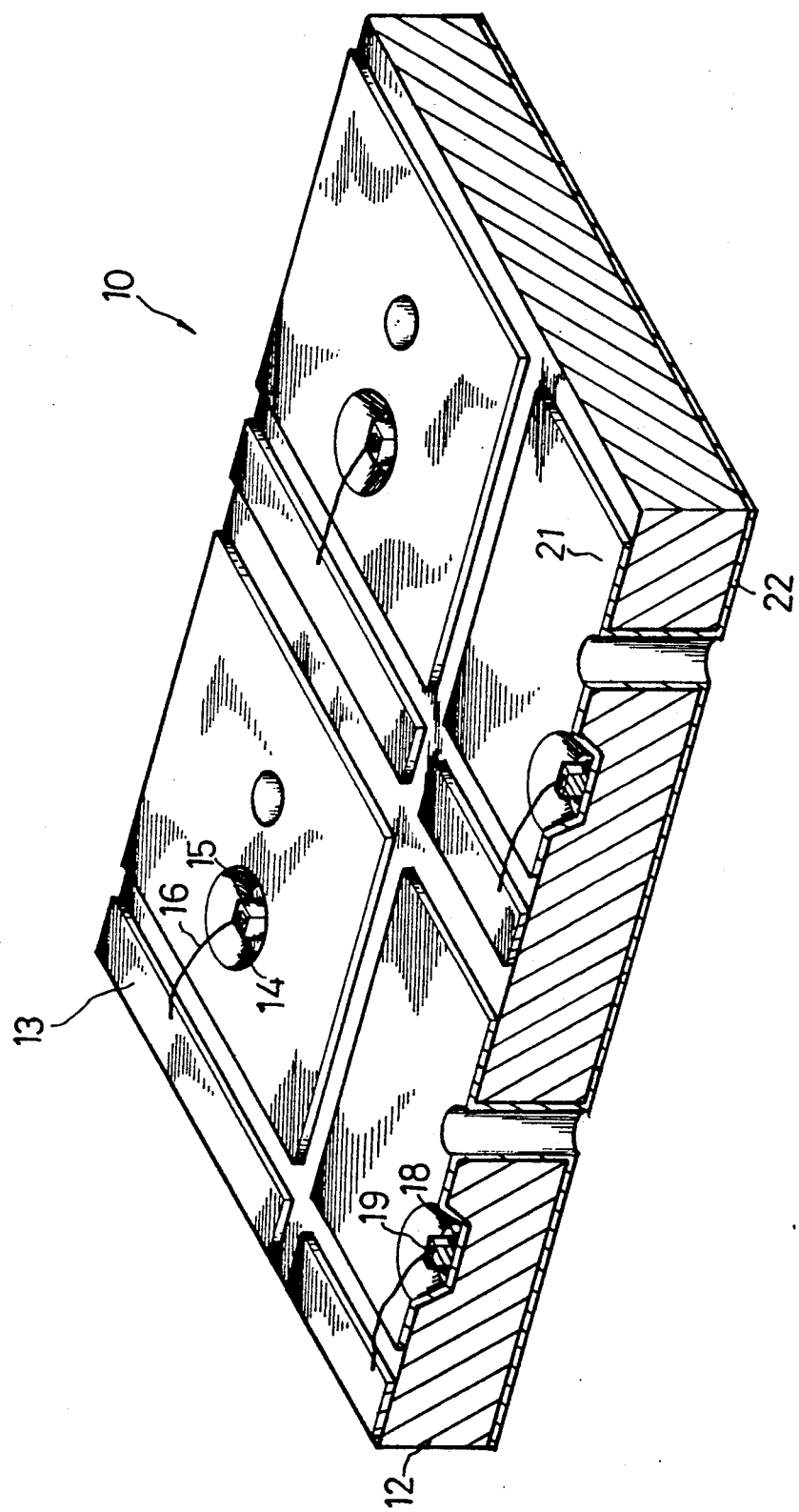
FIG. 1 is a perspective sectional view of the LED display with PCB base of this invention.
Figure 2:
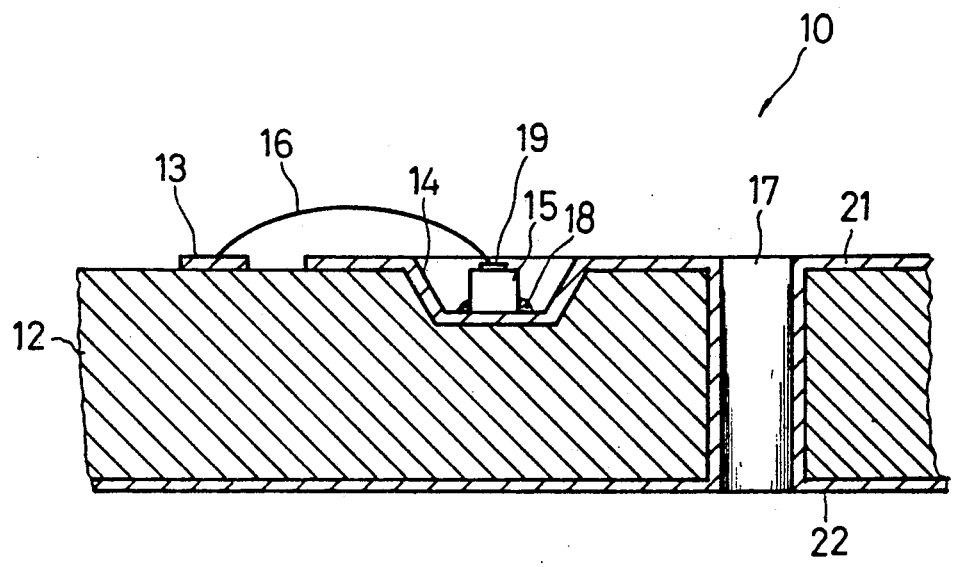
FIG. 2 is a longitudinal sectional view taken through FIG. 1.
Figure 3:
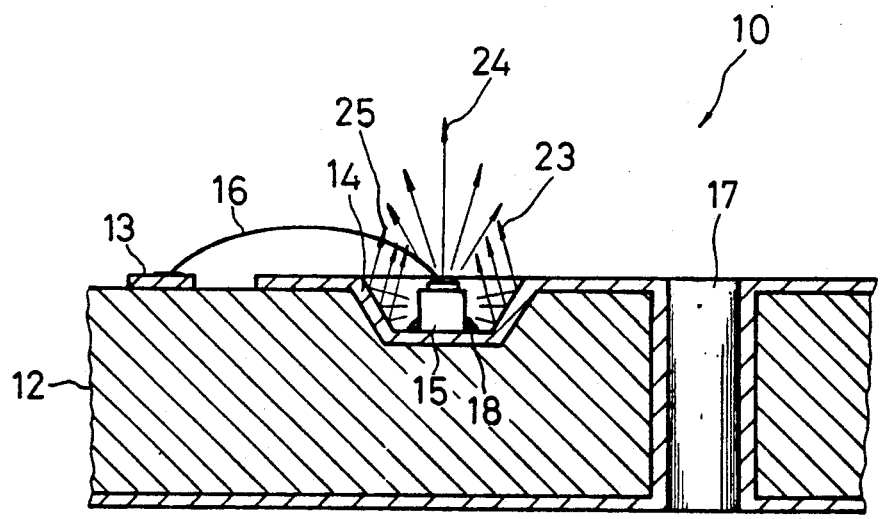
FIG. 3 shows the function of the LED display with PCB base of this invention.

Please refer to FIGS. 1 to 3. The LED display 10 of this invention has a PCB base 12, wherein LED crystals 15 are affixed in bowl-shaped die attach zones 14 of the PCB base 12 by conductive epoxy 18. A bonding pad 19 of the LED crystal 15 is connected by wire 16 with the copper foil 13 disposed on the PCB 12 to serve as another electrode. A plating through hole 17 is formed near the die attach zone 14 to connect the front and rear copper foils 21 and 22 on the PCB 12.

When the LED crystal 15 is powered on to emit light, the light will be emitted from the P-N junction of the crystal 15 and reflected by the bowl-shaped reflector dish 14 of the base and upwards concentrated as shown in FIG. 3 by arrows 23, 24, 25. Therefore, the luminous intensity of the display will be increased. Moreover, when the crystal 15 emits light, the accompanying heat can be rapidly conducted between the copper foil 21 of the die attach zone 14 and the copper foil 22 disposed on the rear surface of the PCB 12 through the plating through holes 17. Such heat-dispersing structure can increase the stability of the forward voltage and wave length (color) of the LED and decrease the light output degradation to prolong the life of the display.

What is claimed is:

1. A lighting display comprising:
   a circuit board having a first face and a second face, a plurality of bowl-shaped cavities in said first face, through holes extending between said faces;
   said cavities and said holes being arranged in a regular pattern, so that there is a single hole associated with each cavity;
   individual thermally conductive foil islands (21) covering preselected areas of the first face of the circuit board; each foil island covering only one of the bowl-shaped cavities and a surrounding area of said first face; each foil island circumscribing an associated through hole;
   each through hole having a thermally conductive lining forming a bridge between the associated foil island and said first thermally conductive foil;
   a light emitting diode crystal bonded to each foil island at a central point in the associated cavity, whereby the foil in each cavity serves as a light reflector;
   foil terminal means (13) on said first face of the circuit board isolated from said foil islands; and a lead wire (16) extending from each crystal to said terminal means.

* * * * *